(12) United States Patent
Krishnan et al.

(10) Patent No.: US 11,121,705 B2
(45) Date of Patent: Sep. 14, 2021

(54) APPARATUS FOR SWITCHING A DIRECT CURRENT IN A POLE OF A DC VOLTAGE NETWORK

(71) Applicant: Siemens Aktiengesellschaft, Munich (DE)

(72) Inventors: Jaganath Krishnan, Nuremberg (DE); Henry Gueldner, Heidenau (DE); Karsten Handt, Berg (DE); Sebastian Nielebock, Forchheim (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 105 days.

(21) Appl. No.: 15/999,691

(22) PCT Filed: Jan. 27, 2017

(86) PCT No.: PCT/EP2017/051787
§ 371 (c)(1),
(2) Date: Aug. 20, 2018

(87) PCT Pub. No.: WO2017/144234
PCT Pub. Date: Aug. 31, 2017

(65) Prior Publication Data
US 2021/0218387 A1    Jul. 15, 2021

(30) Foreign Application Priority Data
Feb. 22, 2016 (DE) .................... 10 2016 202 661.5

(51) Int. Cl.
*H03K 3/012* (2006.01)
*H03K 17/73* (2006.01)

(52) U.S. Cl.
CPC ............. *H03K 3/012* (2013.01); *H03K 17/73* (2013.01)

(58) Field of Classification Search
None
See application file for complete search history.

(56) References Cited

U.S. PATENT DOCUMENTS

| 4,723,187 A | 2/1988 | Howell .......................... 361/13 |
| 5,517,378 A | 5/1996 | Asplund et al. .................. 361/4 |

(Continued)

FOREIGN PATENT DOCUMENTS

| CN | 103370760 A | 10/2013 | ............ H01H 33/12 |
| DE | 69408811 T2 | 10/1998 | ............ H01H 33/59 |

(Continued)

OTHER PUBLICATIONS

Russian Office Action, Application No. 2018130147/07, 10 pages, dated May 16, 2019.

(Continued)

*Primary Examiner* — Daniel C Puentes
(74) *Attorney, Agent, or Firm* — Slayden Grubert Beard PLLC

(57) ABSTRACT

A DC voltage switch may include: a first node and a second node for series integration into a pole of a DC voltage line; a third node for the other pole of the line; a mechanical switch between the first and second nodes; a pulse-current module in parallel with the switch; four semiconductor switches connected as bridges comprising two series of two semiconductor switches; a pulse-current capacitor in parallel with the two series; and a switchable semiconductor element. The pulse-current module includes three module nodes. Potential points between the semiconductor switches of the two series correspond to the first and second module node and the outer ends of the two series of in each case two of the semiconductor switches are connected in pairs to a (Continued)

fourth module node and a fifth module node and the semiconductor element is between the fifth and third module node.

8 Claims, 3 Drawing Sheets

(56) References Cited

U.S. PATENT DOCUMENTS

| | | | |
|---|---|---|---|
| 2013/0278078 A1 | 10/2013 | Ohlsson et al. | 307/113 |
| 2015/0333496 A1 | 11/2015 | Ergin et al. | 361/101 |

FOREIGN PATENT DOCUMENTS

| | | | | |
|---|---|---|---|---|
| EP | 2045823 | A2 | 4/2009 | H01H 1/00 |
| EP | 3032677 | A1 * | 6/2016 | H02H 7/28 |
| SU | 664257 | A1 | 5/1979 | H01J 9/06 |
| WO | 2017/144234 | A1 | 8/1917 | H01H 33/59 |
| WO | 2011/057675 | A1 | 5/2011 | H01H 9/54 |
| WO | 2011/141055 | A1 | 11/2011 | H01H 33/59 |
| WO | 2013/131582 | A1 | 9/2013 | H01H 33/59 |
| WO | 2014/094847 | A1 | 6/2014 | H01H 33/59 |

OTHER PUBLICATIONS

German Office Action, Application No. 102016202661.5, 7 pages, dated Nov. 30, 2016.
International Search Report and Written Opinion, Application No. PCT/EP2017/051787, 22 pages, dated Apr. 12, 2017.

* cited by examiner

APPARATUS FOR SWITCHING A DIRECT CURRENT IN A POLE OF A DC VOLTAGE NETWORK

CROSS-REFERENCE TO RELATED APPLICATIONS

This application is a U.S. National Stage Application of International Application No. PCT/EP2017/051787 filed Jan. 27, 2017, which designates the United States of America, and claims priority to DE Application No. 10 2016 202 661.5 filed Feb. 22, 2016, the contents of which are hereby incorporated by reference in their entirety.

TECHNICAL FIELD

The present disclosure relates to DC voltage networks. Various embodiments may include an apparatus for switching a direct current in a pole of a DC voltage network branch.

BACKGROUND

The globally rising energy demand and the simultaneously desired reduction of $CO_2$ emissions are making renewable energies increasingly more attractive. Sources of renewable energies include, for example, offshore wind turbines or else photovoltaic power plants in sunny desert areas. In order to be able to make economical use of the energy generated thereby, the connection of the renewable energy sources to an onshore power network is growing in importance. Against this background, there is an increasing focus on the construction and the operation of a meshed DC voltage network. However, this requires being able to switch off short-circuit currents that may occur in such a meshed DC voltage network in a rapid and reliable manner. However, this requires DC voltage switches, which until now have not been commercially available. Various concepts for a DC voltage switch of this kind are known from the prior art.

WO 2011/057675 A1 describes a DC voltage switch, which has an operating current path with a mechanical switch and a switch-off branch, which is connected in parallel with the operating current path. A series circuit composed of power semiconductor switches is arranged in the switch-off branch, a freewheeling diode being connected in each case in the opposite direction in parallel with said power semiconductor switches. The switching units composed of power semiconductor switches and freewheeling diode are arranged back-to-back, wherein the power semiconductor switches that can be switched off are arranged in series and, for each power semiconductor switch, a corresponding power semiconductor switch with opposite forward direction is provided. In this way, the current can be interrupted in both directions in the switch-off branch. In the operating current path, in addition to the mechanical switch, an electronic auxiliary switch is also arranged in series with the mechanical switch.

During normal operation, the current flows via the operating current path and thus via the electronic auxiliary switch and via the closed mechanical switch since the power semiconductor switches of the switch-off branch represent an increased resistance to the direct current. To interrupt a short-circuit current, for example, the electronic auxiliary switch is transferred to its blocking position. As a result of this, the resistance in the operating current path increases, with the result that the direct current commutates into the switch-off branch. The rapid mechanical isolating switch can therefore be opened with no current flowing. The short-circuit current conducted via the switch-off branch can be interrupted by the power semiconductor switches. To accommodate the energy that is stored in the DC voltage network and is to be dissipated during switching, arresters are provided, which arresters are in each case connected in parallel with the power semiconductor switches of the switch-off branch.

DE 694 08 811 T2 describes a DC voltage switch, in which two mechanical switches are connected in series. The series circuit consisting of the two mechanical switches is protected against high overvoltages by an arrester and a capacitor. A power semiconductor switch that can be switched on and off is connected in parallel with just one of the mechanical switches. An electric arc is produced when the mechanical switches are opened. The voltage dropped at the electric arc ignites the power semiconductor switch, as a result of which the parallel opened mechanical switch is short-circuited. The electric arc is extinguished. The current conducted via the power semiconductor switch can now be interrupted by appropriate actuation of the power semiconductor.

WO 2011/141055 discloses a DC voltage switch, which can be connected in series in a pole of a high-voltage DC network. The DC voltage switch consists of a mechanical switch in series with a power semiconductor switch, with which a freewheeling diode arranged in the opposite direction is again connected in parallel. A series circuit composed of a coil and a capacitor, that is to say an LC branch, and an arrester, which limits the voltage dropped across the LC branch, are connected in parallel with the series circuit composed of the power semiconductor switch and the mechanical switch. An arrester is also connected in parallel with the power semiconductor switch. After the mechanical switch has been opened, the power semiconductor switch is switched on and off at the inherent frequency of the LC branch. As a result thereof, an oscillation and ultimately a current zero crossing are generated in the mechanical switch so that the electric arc that is produced can be extinguished.

SUMMARY

The teachings of the present disclosure describe an apparatus that can be used to switch off fault currents in a DC voltage network in a reliable and cost-effective manner, wherein at the same time low losses occur during normal operation. For example, some embodiments include a DC voltage switch (10, 40) having a first and second node (101, 102) for series integration into a pole (1) of a DC voltage line and having a third node (103) for connection to the other pole of the DC voltage line, further comprising: a mechanical switch (11) arranged between the first and second node (101, 102), at least one pulse-current module (41, 42) arranged between the first and second node (101, 102) and in parallel with the mechanical switch (11), wherein the pulse-current module (41, 42) has three module nodes (201, 202, 203) and the first module node (201) is connected to the first node (101) and the second module node (202) is connected to the second node (102) and the third module node (203) is connected to the third node (103); comprises four semiconductor switches (21 . . . 24), which are connected as bridges composed of two series of in each case two of the semiconductor switches (21 . . . 24), wherein the potential points between the semiconductor switches (21 . . . 24) of the two series correspond to the first and second module node (201, 202) and the outer ends of the two series of in each case two of the semiconductor switches (21 . . . 24) are connected in pairs to a fourth and fifth module node (204, 205); comprises a pulse-current capacitor (25), which is connected in parallel with the two series of in each case two of the semiconductor switches (21 . . . 24); and comprises a switchable semiconductor element (27) between the fifth and third module node (205, 203).

In some embodiments, there is a freewheeling diode (13) between the third and the first node (103, 101) and a further freewheeling diode (14) between the third and the second node (103, 102).

In some embodiments, there is a resistor (28) arranged in series with the pulse-current capacitor (25) for the purpose of load current limitation.

In some embodiments, there is a plurality of pulse-current modules (41, 42), which are connected in series with their first and second module nodes (201, 202) and the series is arranged between the first and second node (101, 102).

In some embodiments, the mechanical switch (11) has a switching time of less than 5 ms.

In some embodiments, the switchable semiconductor element (27) is a thyristor (27).

In some embodiments, there is a control device, which is configured to open the mechanical switch (11) for isolation of the DC voltage line and to switch on two of the four semiconductor switches (21 . . . 24) for the generation of a current pulse in the opposite direction to the current in the DC voltage line.

In some embodiments, the control device is further configured to switch on the switchable semiconductor element (27) upon isolation of the DC voltage line.

BRIEF DESCRIPTION OF THE DRAWINGS

Further expedient configurations and features of the systems described herein are the subject matter of the following description of exemplary embodiments with reference to the figures of the drawing, wherein the same reference signs refer to components with the same function and wherein.

DETAILED DESCRIPTION

Figure 1:
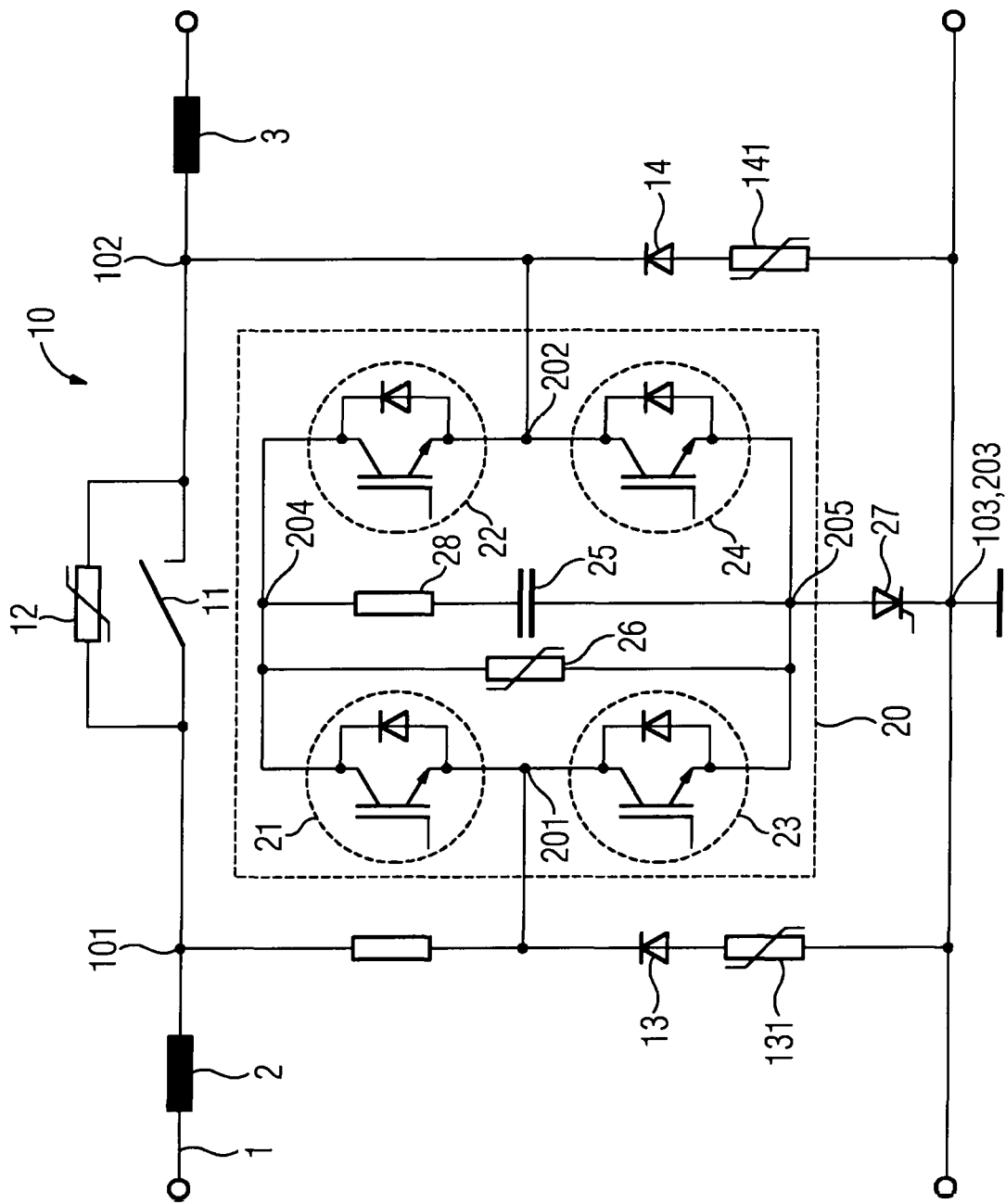
FIG. 1 shows a first exemplary embodiment of the DC voltage switch according to the teachings herein.

In some embodiments, there is a DC voltage switch having a first and second node for series integration into a pole of a DC voltage line and having a third node for connection to the other pole of the DC voltage line, further comprising:
- a mechanical switch arranged between the first and second node,
- at least one pulse-current module arranged between the first and second node and in parallel with the mechanical switch, wherein the pulse-current module
    has three module nodes and the first module node is connected to the first node and the second module node is connected to the second node and the third module node is connected to the third node;
    comprises four semiconductor switches, which are connected as bridges composed of two series of in each case two of the semiconductor switches, wherein the potential points between the semiconductor switches of the two series correspond to the first and second module node and the outer ends of the two series of in each case two of the semiconductor switches are connected in pairs to a fourth and fifth module node;
    comprises a pulse-current capacitor, which is connected in parallel with the two series of in each case two of the semiconductor switches;
    comprises a switchable semiconductor element between the fifth and third module node.

In some embodiments, the semiconductor switches comprise at least one power semiconductor switch that can be switched on and off, e.g. an IGBT, IGCT, GTO or the like, with in each case a freewheeling diode connected in the opposite direction in parallel. In some embodiments, a synchronously actuated series circuit of power semiconductor switches can also be used instead of a single power semiconductor switch. The synchronously actuated power semiconductor switches of the series circuit then behave exactly like a single power semiconductor switch.

If the DC voltage switch is ready for operation, a short-circuit current can be interrupted, for example. During normal operation, a direct current flows via the mechanical switch in a virtually loss-free manner. In the event of a fault, the mechanical switch opens and two diagonally located semiconductor switches of the pulse-current module are turned on. Due to the isolation of the contacts of the mechanical switch, an electric arc would be drawn if no further measures were to be provided. However, the turning on of the semiconductor switches suppresses the production of an electric arc completely in the ideal case. The opening of the switches creates a current path for the charge stored in the pulse-current capacitor, as a result of which a current zero crossing passes in the mechanical switch, as a result of which the electric arc is prevented or extinguished. The DC voltage switch can advantageously interrupt a flow of current in both directions.

In some embodiments, the inductively stored energy of the DC voltage network is dissipated on a first side of the DC voltage switch via a current path, which leads via one of the semiconductor switches that is not switched on and the pulse-current capacitor to the third node, that is to say to the other pole of the DC voltage network. When the DC voltage switch has a freewheeling diode between the third and the first node and a further freewheeling diode between the third and the second node, this permits dissipation of the inductively stored energy of the DC voltage network.

In some embodiments, the DC voltage switch can comprise a plurality of the pulse-current modules in order to adjust to the operating voltage and operating current of the DC voltage network. Said pulse-current modules are in this case connected in series with their first and second module nodes. Said series itself is then arranged between the first and second node. The number of pulse-current modules depends on the respective requirements. In any case, the pulse-current modules have to be capable of taking up the applied voltages and also of switching off high short-circuit currents reliably and sufficiently quickly.

In some embodiments, the DC voltage switch comprises a resistor in series with the pulse-current capacitor for the purpose of load current limitation. A thyristor may be used as the switchable semiconductor element in the pulse-current module.

In some embodiments, the DC voltage switch comprises a control device configured to open the mechanical switch for isolation of the DC voltage line and to switch on two of the four semiconductor switches for the generation of a current pulse in the opposite direction to the current in the DC voltage line.

In some embodiments, the energy stored in the DC voltage network and released during switch-off is dissipated by expedient means for dissipating the switching energy. In some embodiments, said means are, for example, non-linear resistors, for example arresters, varistors or the like. If the voltage dropped across said means exceeds a threshold voltage, said components behave like ohmic resistors, wherein they convert the energy that is released during switching to thermal energy and dissipate this to the external atmosphere.

In some embodiments, the mechanical switch comprises a rapid switch set up to open within from 1 ms to 10 ms. Rapid switches of this kind have a low switching mass, which has to be moved during switching. Furthermore, rapidly responding drives, for example electrodynamic drives, are required.

In some embodiments, the apparatus is used in modular fashion and hence used as a bipolar or two-pole component in a series circuit.

In some embodiments, although power semiconductor switches that can be switched on and off are in this case always disclosed in connection with in each case a freewheeling diode connected in the opposite direction in parallel or as reverse-conducting power semiconductors, this is predominantly due to the fact that power semiconductors that can be switched off like IGBTs, IGCTs, GTOs or the like are generally always marketed having a freewheeling diode connected in the opposite direction in parallel. Such a freewheeling diode connected in the opposite direction serves to protect the power semiconductor switch, which is extremely sensitive with respect to a voltage that is opposite to its forward direction. However, said freewheeling diode is not required. These cases are clearly apparent to those skilled in the art; therefore, reference is not made to them separately in individual cases. However, implementations in which the freewheeling diode connected in the opposite direction in parallel with the power semiconductor switch may be omitted, depending on the function, should also be included in the scope of protection.

FIG. 1 shows an embodiment of the DC voltage switch 10 according to the teachings herein, which can be connected with a first and second node 101, 102 in series in a pole, that is to say a line of a DC voltage network 1. The DC voltage switch serves to interrupt a flow of current in the pole of the DC voltage network. The DC voltage switch 10 has a first current branch between the first and second node 101, 102, which first current branch does not comprise any semiconductor elements but comprises just one mechanical switch 11. As a result, only very low electrical losses occur here and the current flows substantially in the first current branch during running operation. An energy absorber, for example a varistor 12, is optionally provided in the first current branch. Said varistor is connected in parallel with the mechanical switch.

A second current branch is located connected in parallel therewith, that is to say likewise between the first and second node 101, 102. The second current branch does not allow flow of current or only an insignificant flow of current in the normal operating state. The second current branch comprises a pulse-current module 20. The pulse-current module 20 is also further connected to a third node 103 of the DC voltage switch 10, which third node is connected to the other pole of the DC voltage network 1. Starting from the third node 103, two freewheeling diodes 13, 14 lead to the first and second node 101, 102, respectively. A further energy absorber 131, 141 can optionally be provided in each case in series with the freewheeling diodes 13, 14.

In some embodiments, the pulse-current module 20 itself comprises a first to fifth module node 201 . . . 205. In this case, the first module node 201 is connected to the first node 101, the second module node 202 is connected to the second node 102 and the third module node 203 is connected to the third node 103.

In some embodiments, the pulse-current module 20 comprises a first to fourth semiconductor switch 21 . . . 24, a pulse-current capacitor 25 and a thyristor 27. An energy absorber 26 and/or a charging resistor 28 is optionally provided. The pulse-current capacitor has, for example, a capacitance of 10 mF.

The first module node 201 is the potential point between the first and third semiconductor switch 21, 23, which are connected in series in the same direction. The second module node 202 is the potential point between the second and fourth semiconductor switch 22, 24, which are likewise connected in series in the same direction. The connections of the first and second semiconductor switch 21, 22, which connections are remote from the first and second module node 201, 202, are interconnected with the fourth module node 204. The connections of the third and fourth semiconductor switch 23, 24, which connections are remote from the first and second module node 201, 202, are interconnected with the fifth module node 205.

In some embodiments, the thyristor 27 is arranged between the fifth module node 205 and the third module node 203, wherein said thyristor is arranged in a blocking manner from the point of view of the third module node 203. The pulse-current capacitor 25 is arranged between the fourth and fifth module node 204, 205. The optional charging resistor 28 is arranged in series with the pulse-current capacitor 25. The energy absorber 26 is arranged between the fourth and fifth module node 204, 205, that is to say in parallel with the pulse-current capacitor 25.

During running operation, the direct current flows via the mechanical switch 11. The pulse-current capacitor 25 is charged by turning on the thyristor 27. If a short-circuit is now detected or if it is necessary to switch off the current for some other reason, the controller (not illustrated in FIG. 1) of the DC voltage switch 10 performs switching operations.

In a first step, the mechanical switch 11 is opened and two diagonally located semiconductor switches of the four semiconductor switches 21 . . . 24 are turned on. If the flow of current during running operation ran from the side of the first node 101 to the side of the second node 102, the second and third semiconductor switch 22, 23 are turned on; in the case of the other current direction, the first and fourth semiconductor switch 21, 24 are turned on. In the following text, a current direction from the side of the first node 101 to the side of the second node 102 is assumed.

Figure 2:
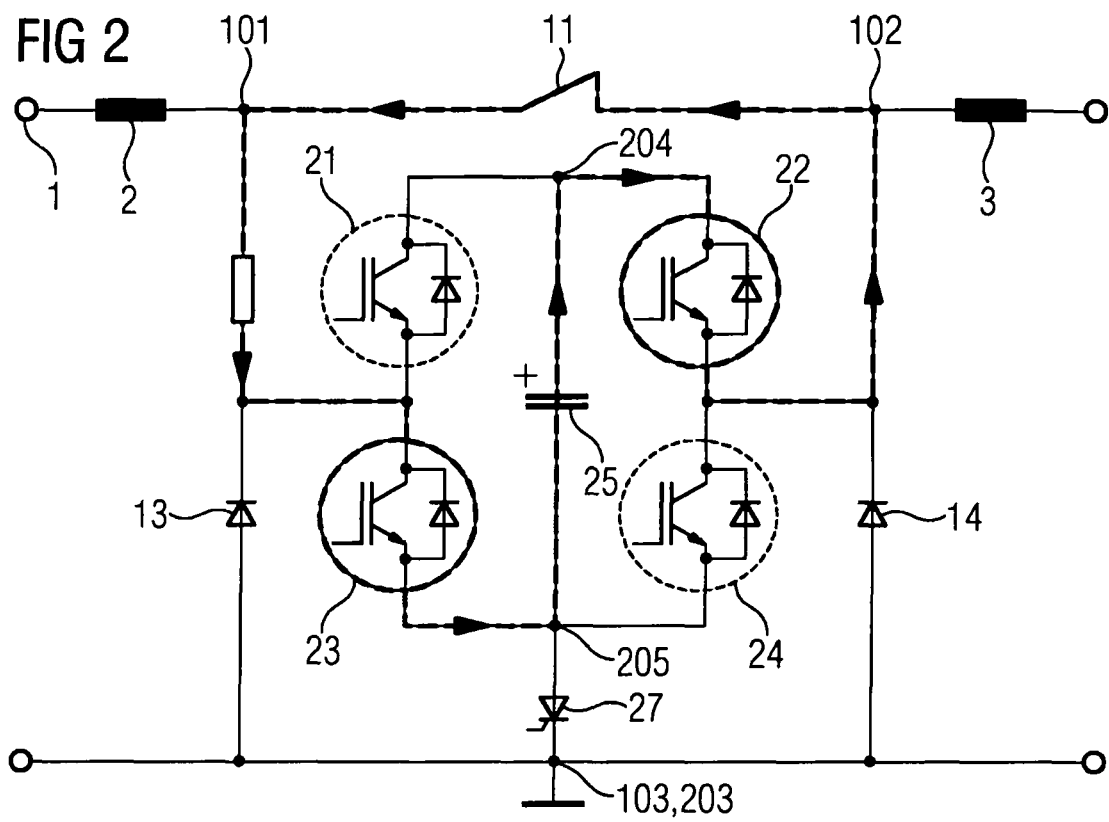
FIGS. 2 and 3 show the exemplary embodiment according to FIG. 1 with different current paths during switch-off.

Turning on the respective two semiconductor switches 21 . . . 24 produces a circuit by means of which the pulse-current capacitor 25 on a path via the second node 102, the mechanical switch 11 and the first node 101 can discharge. This generates a current pulse, which is opposed to the current from the running operation or the short-circuit current and thus generates a current zero crossing. At this current zero crossing, a possibly present electric arc in the mechanical switch 11 is extinguished. This opens the path to switch off the current in the semiconductor switches 21 . . . 24. The circuit is marked in FIG. 2.

The fault current or operating current flows at this point through the diodes of the first and fourth semiconductor switch 21, 24. The controller now ensures that the mechanical switch 11 is completely open. Another path is then expediently provided for the current.

Figure 3:
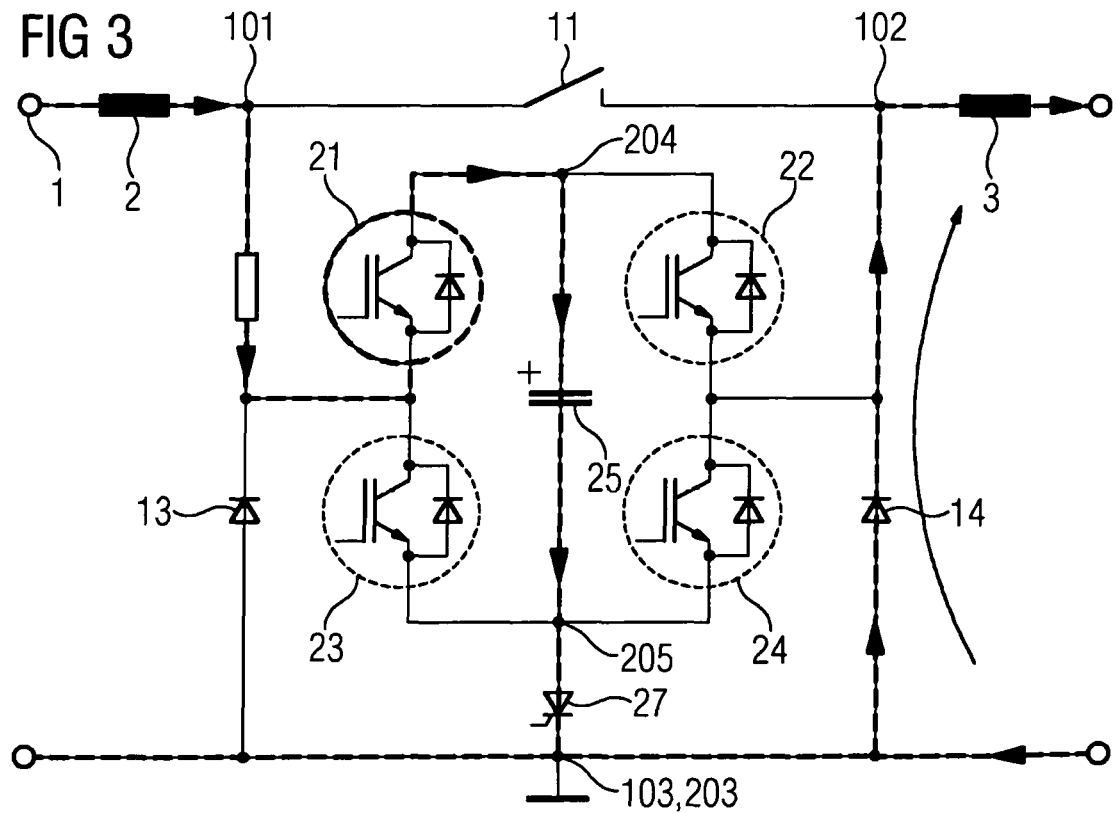

In order to provide a freewheeling path for the fault current, the thyristor 27 is subsequently turned on. This produces current paths, which are illustrated in FIG. 3, for the case of a flow of current in the direction from the first to the second node 101, 102. The anode of the diode of the fourth semiconductor switch 24 is grounded by the turning on of the thyristor 27, as a result of which said diode no longer conducts. A freewheeling path then leads for the current that is driven remotely from the load from the first node 101 via the diode of the first semiconductor switch 21, which itself, however, is switched off, via the pulse-current capacitor 25 and the thyristor 27 to the third node 103, that is to say to the other pole of the DC voltage network 1. The freewheeling path for the current driven on the load side leads via the freewheeling diode 14 from the third to the second node 103, 102.

The pulse-current capacitor 25 is now charged until the inductively stored energy is consumed remotely from the load and the thyristor is consequently switched off in the absence of a further flow of current.

Figure 4:
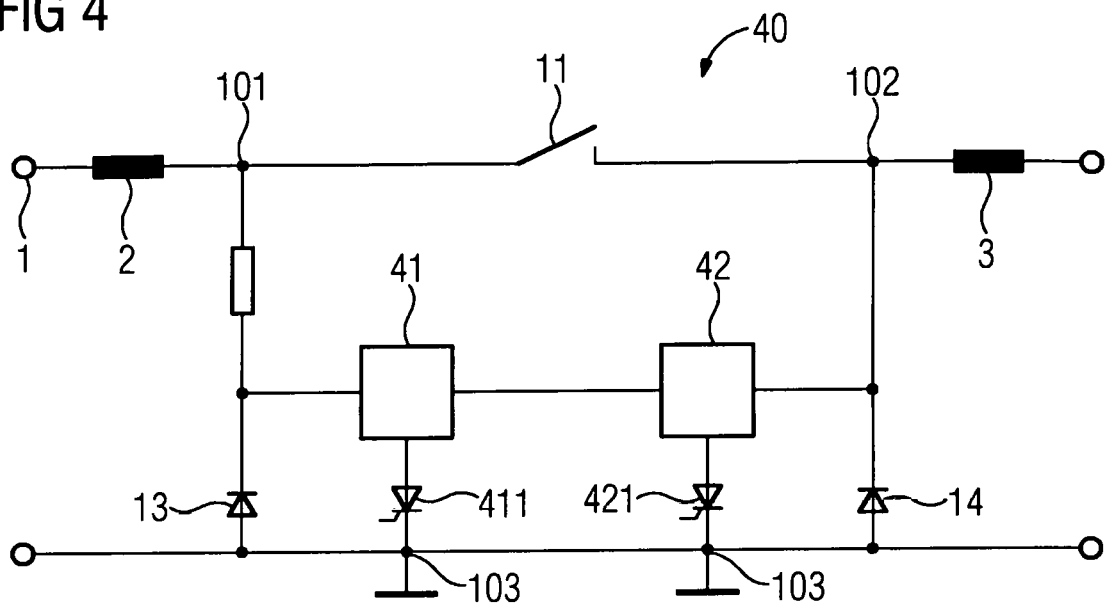
FIG. 4 shows a further exemplary embodiment of the apparatus according to the teachings herein.

FIG. 4 shows a second DC voltage switch 40 in which a plurality of pulse-current modules 20 are used. Parts of the DC voltage switch 40 and the surrounding parts of the DC voltage network 1, which are unchanged compared to the first exemplary embodiment of FIG. 1, are provided with the same reference signs in FIG. 4 as in FIG. 1.

In contrast to the embodiment according to FIG. 1, two pulse-current modules 41, 42 are now arranged in the second current path, which in the first exemplary embodiment leads via the pulse-current module 20. The connection to the outside takes place in the pulse-current modules 41, 42 in the exact same way as in the pulse-current module 20 according to FIG. 1, that is to say via the first, second and third module node 201, 202, 203.

The pulse-current modules 41, 42 in FIG. 4 do not comprise the respectively associated thyristor 411, 421 only for the sake of clarity, whereas in FIG. 1 the pulse-current module 20 includes the thyristor 27. Nevertheless, each of the pulse-current modules 41, 42 in FIG. 4 is connected to a respective separate thyristor 411, 421 at the third node, that is to say the pole of the DC voltage network 1 that is not to be switched.

Figure 5:
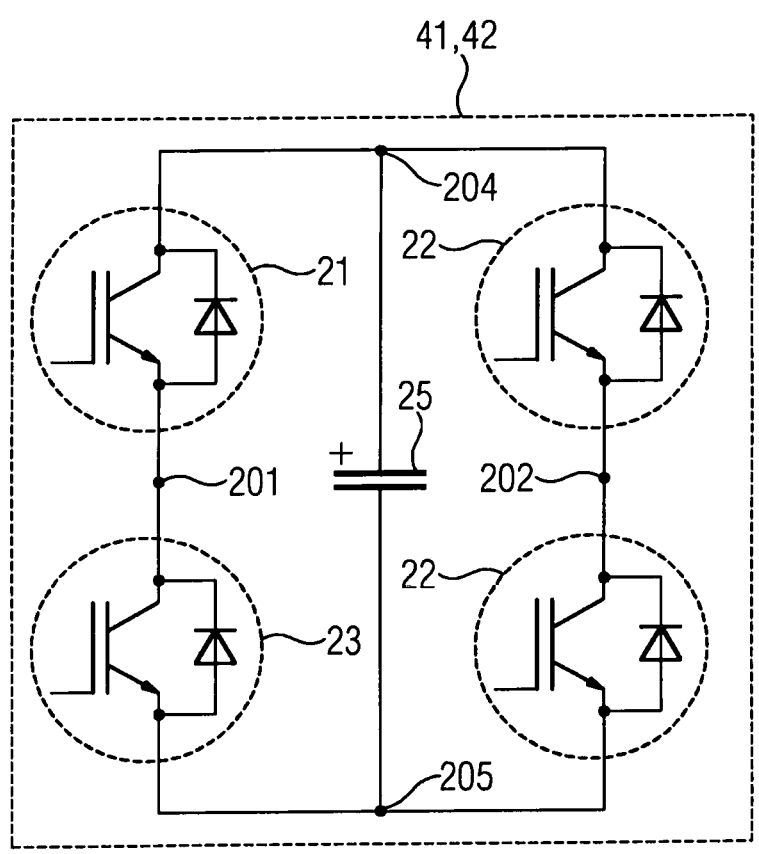
FIG. 5 shows a pulse-current module.

Each of the pulse-current modules 41, 42 of FIG. 4 is illustrated in simplified fashion in FIG. 5 and corresponds substantially to the pulse-current module 20 of FIG. 1. The first module node 201 of the first pulse-current module 41 is connected to the first node 101 and the second module node 202 of the first pulse-current module 41 is connected to the first module node 201 of the second pulse-current module 42. The second module node 202 of the second pulse-current module 42 is connected to the second node 102.

The load-bearing ability of the DC voltage switch can be adjusted using a current that can be switched off or a voltage that is to be switched off by way of a series connection of this kind or a parallel connection of the pulse-current modules 41, 42, wherein standard component parts in the field of switches and capacitors can also be used. For example, the DC voltage switch can be dimensioned to an operating voltage of 70 kV or even higher values by way of a series connection of a plurality of pulse-current modules 41, 42.

What is claimed is:

1. A DC voltage switch comprising:
a first node;
a second node for series integration with the first node into a pole of a DC voltage line;
a third node for connection to the other pole of the DC voltage line;
a mechanical switch arranged between the first node and the second node;
a pulse current module arranged between the first node and the second node and in parallel with the mechanical switch;
wherein the pulse-current module
includes three module nodes, the first module node is connected to the first node and the second module node is connected to the second node and the third module node is connected to the third node;
four semiconductor switches connected as bridges comprising two series of two of the semiconductor switches;
wherein potential points between the semiconductor switches of the two series correspond to the first and second module node and the outer ends of the two series of in each case two of the semiconductor switches are connected in pairs to a fourth module node and a fifth module node;
a pulse current capacitor connected in parallel with the two series of in each case two of the semiconductor switches; and
a switchable semiconductor element between the fifth and third module node.

2. The DC voltage switch as claimed in claim 1, further comprising:
a first freewheeling diode between the third node and the first node; and
a second freewheeling diode between the third node and the second node.

3. The DC voltage switch as claimed in claim 1, further comprising a resistor arranged in series with the pulse-current capacitor for load current limitation.

4. The DC voltage switch as claimed in claim 1, further comprising a plurality of pulse-current modules connected in series with the corresponding first modules nodes and second module nodes and the series is arranged between the first node and second node.

5. The DC voltage switch as claimed in claim 1, wherein the mechanical switch has an associated switching time of less than 5 ms.

6. The DC voltage switch as claimed in claim 1, wherein the switchable semiconductor element comprises a thyristor.

7. The DC voltage switch as claimed in claim 1, further comprising a control device configured to:
open the mechanical switch for isolation of the DC voltage line; and
switch on two of the four semiconductor switches for generating a current pulse in the opposite direction to a current in the DC voltage line.

8. The DC voltage switch as claimed in claim 6, wherein the control device is further configured to switch on the switchable semiconductor element upon isolation of the DC voltage line.

* * * * *